United States Patent
Li et al.

(10) Patent No.: US 11,366,502 B2
(45) Date of Patent: Jun. 21, 2022

(54) FAN FAILURE DETECTION

(71) Applicant: QUANTA COMPUTER INC., Taoyuan (TW)

(72) Inventors: Yung-Fu Li, Taoyuan (TW); Yi-Hsing Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 127 days.

(21) Appl. No.: 16/876,332

(22) Filed: May 18, 2020

(65) Prior Publication Data

US 2021/0357011 A1    Nov. 18, 2021

(51) Int. Cl.
G06F 1/20 (2006.01)
H05K 7/20 (2006.01)
F24F 11/77 (2018.01)
F24F 11/32 (2018.01)
F24F 11/52 (2018.01)

(52) U.S. Cl.
CPC .............. *G06F 1/206* (2013.01); *F24F 11/32* (2018.01); *F24F 11/52* (2018.01); *F24F 11/77* (2018.01); *H05K 7/20209* (2013.01)

(58) Field of Classification Search
CPC . G06F 1/206; F24F 11/32; F24F 11/77; F24F 11/52; H05K 7/20209
USPC ........................................................ 700/300
See application file for complete search history.

(56) References Cited

U.S. PATENT DOCUMENTS

| | | | | |
|---|---|---|---|---|
| 6,407,672 B1* | 6/2002 | Grenz | ...................... | G06F 1/206 340/507 |
| 10,168,748 B2 | 1/2019 | Shabbir et al. | | |
| 10,289,177 B2 | 5/2019 | Shabbir et al. | | |
| 2003/0234630 A1* | 12/2003 | Blake | ................. | H05K 7/20209 318/471 |
| 2010/0094593 A1* | 4/2010 | Reddy | ....................... | G06F 1/20 702/183 |
| 2017/0350403 A1* | 12/2017 | Kelly | .................... | F04D 29/582 |

(Continued)

FOREIGN PATENT DOCUMENTS

CN    104572399 B    2/2019
CN    106547325 B    3/2019

(Continued)

OTHER PUBLICATIONS

TW Office Action for Application No. 109134870, dated Aug. 4, 2021, w/ First Office Action Summary.

(Continued)

*Primary Examiner* — Robert A Cassity
(74) *Attorney, Agent, or Firm* — Nixon Peabody LLP

(57) ABSTRACT

Techniques are disclosed for early detection of fan failure in a computing device, such as a server. A management device located in the computing device or remote from the computing device can receive information about the fan duty and use the fan duty information to determine a safe fan speed below which future or imminent fan failure can be inferred. The management device can receive the current speed of the fan and compare it with the safe fan speed to determine if the fan is likely to fail, in which case the management device can direct the computing device to perform mitigation action and/or a maintenance warning can be sent. The maintenance warning can result in replacement of the failing or soon-to-fail fan.

18 Claims, 10 Drawing Sheets

(56) References Cited

U.S. PATENT DOCUMENTS

2018/0373300 A1* 12/2018 Bhatia .................. G06F 1/206
2019/0219061 A1*  7/2019 Tseng .................. F04D 25/166
2020/0241520 A1*  7/2020 Gross ................. G05B 23/0283

FOREIGN PATENT DOCUMENTS

| CN | 106325464 B | 12/2019 |
| JP | 5672099 B2 | 2/2015 |
| TW | 201600960 A | 1/2016 |
| TW | 201714086 A | 4/2017 |
| TW | 201727500 A | 8/2017 |

OTHER PUBLICATIONS

TW Search Report for Application No. 109134870, dated Aug. 4, 2021, w/ First Office Action.

* cited by examiner

FAN FAILURE DETECTION

TECHNICAL FIELD

The present disclosure relates to computing system generally and more specifically to cooling systems.

BACKGROUND

In computing systems, especially servers in datacenters, active cooling is important to keep the components of the computing system sufficiently cooled during operation. Since high-performance equipment (e.g., central processing units (CPUs), graphic processing units (GPUs), network interface cards (NICs), and the like) often generate large amounts of heat during operation, they must be appropriately cooled to ensure continued operation. If a cooling device, such as a fan, fails in some fashion, it may provide insufficient cooling, may provide no cooling, or may hinder the cooling ability of other cooling devices. When the cooling performance of a computing system is degraded, the computing system may be required to enter a reduced-power mode having lower performance or may even be required to shut down completely. Time spent with a computing system in a lower performance mode or a powered off state can cause significant economic and other damages. If the heat generated is too much, it may damage the computing system, which may cause even further damages.

Thus, if a fan fails in a datacenter, it can be important to repair the fan as quickly as possible. This repair can require a technician to identify the server containing the failed fan in the rack, shut down the server, remove the server from the rack, open the server, replace the fan, place the server back into position the rack, and start the server back up again. This entire process takes time and can increase the risk of damage to the system.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include systems, methods, and computer-program products for performing certain methods as disclosed herein. In some cases, a system can include one or more data processors and a non-transitory computer-readable storage medium containing instructions which, when executed on the one or more data processors, cause the one or more data processors to perform operations of the methods. In some cases, a computer-program product can be tangibly embodied in a non-transitory machine-readable storage medium, including instructions configured to cause a data processing apparatus to perform operations of the methods. The methods can include receiving fan duty information associated with a fan of a computing device; determining a safe fan speed associated with the fan using the received fan duty information; receiving a current fan speed associated with the fan; generating a fan safety inference using the current fan speed and the safe fan speed, wherein generating the fan safety inference comprises comparing the current fan speed with the safe fan speed; and generating a maintenance warning when the fan safety inference is indicative of an unsafe condition, wherein the warning is usable to initiate replacement of the fan.

In some cases, the fan safety inference is indicative of the unsafe condition when the current fan speed is lower than the safe fan speed. In some cases, determining the safe fan speed comprises applying the received fan duty information to a lookup table to identify a safe fan speed. In some cases, receiving the fan duty information associated with the fan of the computing device comprises receiving the fan duty information through a network interface. In some cases, the methods further include transmitting the maintenance warning to the computing device, wherein the maintenance warning, when received by the computing device, causes the computing device to output a visual indication of a relative location of the fan within the computing device, and wherein the maintenance warning, when generated, causes a maintenance task list to be appended with an instruction to replace the fan. In some cases, the methods can further include taking a mitigation action when the fan safety inference is indicative of an unsafe condition, wherein taking the mitigation action includes adjusting a fan duty used to drive the fan or an alternate fan of the computing device. In some cases, the maintenance warning, when generated, causes a maintenance task list to be appended with an instruction to replace the fan.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
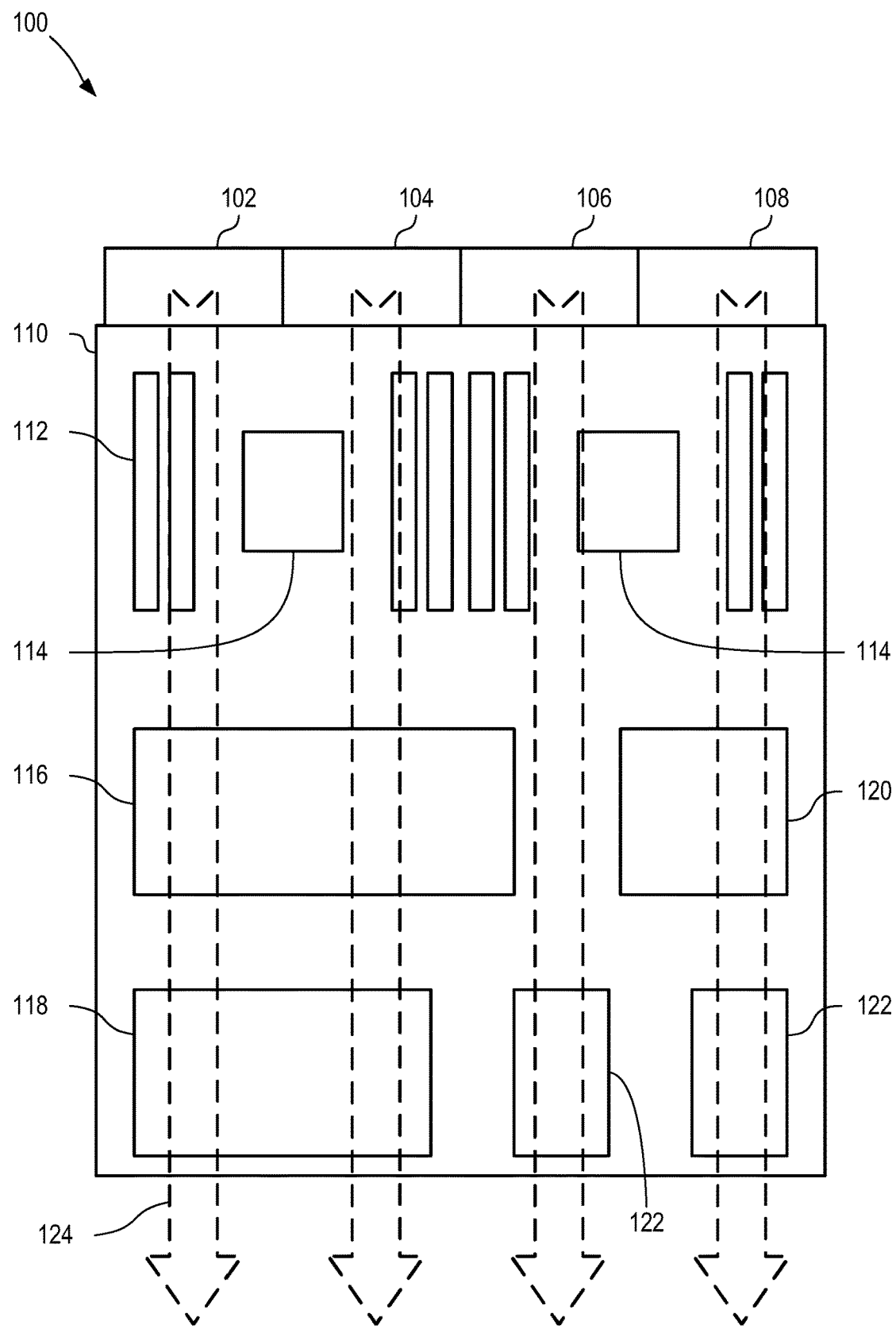
FIG. 1 is a schematic top view of a computing device with functional fans, according to certain aspects of the present disclosure.

Certain aspects and features of the present disclosure relate to early detection of fan failure in a computing device, such as a server. A management device located in the computing device or remote from the computing device can receive information about the fan duty and use the fan duty information to determine a safe fan speed below which future or imminent fan failure can be inferred. The management device can receive the current speed of the fan and compare it with the safe fan speed to determine if the fan is likely to fail, in which case the management device can direct the computing device to perform mitigation action and/or a maintenance warning can be sent. The maintenance warning can result in replacement of the failing or soon-to-fail fan.

In traditional systems, when a fan unit fails, that system may need to be completely disabled or run at reduced power until maintenance can be scheduled and completed. The downtime that results from a failed fan can be extremely costly and inconvenient, especially for mission-critical deployments. While it can be useful to keep track of a fan's lifelong runtime to predict when to replace the fan, such approaches to fan maintenance cannot take into account all of the variables in operating conditions and fan manufacture of an individual fan, and instead rely on large averages. Certain aspects of the present disclosure permit individual fans to be tracked independently such that the failure of any individual fan in a system can be accurately predicted.

Certain aspects of the present disclosure make use of data collected by one or more controllers in a computing system that drive fans of the computing system. Generally, such a controller, such as a baseboard management controller (BMC) or other controller, can drive a fan using a pulse width modulation (PWM) signal. The PWM signal can have a particular duty cycle that drives the fan's motor. Each fan can be driven at a desired fan duty. For example, a fan duty of 100% can represent a fan being driven at 100% of its rated fan speed. In some cases, a fan may be driven at lower fan duties or even potentially higher fan duties. In normal operation, driving a fan at a particular fan duty will result in a particular fan speed. In some cases, a new fan's normal fan duty to fan speed relationship can be affected by the fan's style, brand, manufacturing techniques, or other variables.

A fan's fan duty to speed relationship can change over time, especially as the fan approaches a failure condition. A failure condition for a fan can be defined in various ways based on manufacturer specifications, consumer specifications, or otherwise. In an example, a fan can be considered as failed if it can no longer provide adequate cooling to permit the computing system in which it is installed to run at full speed. In some cases, a fan can be considered as failed if, while being driven at 100% duty cycle, it operates only up to speeds at or less than approximately 95%, 90%, 85%, 80%, 75%, 70%, 65%, 60%, 55%, 50%, 45%, 40%, 35%, 30%, 25%, 20%, 15%, 10%, and/or 5% of its rated speed. Other failure conditions can be used.

Certain aspects of the present disclosure relate to determining a safe fan speed below which an inference can be made that the fan in question is likely to fail soon. A fan likely to fail soon can be expected to fail imminently and/or expected to fail within a certain length of time, such as prior to an upcoming scheduled maintenance or such as within a set number of hours, days, weeks, and/or months. For example, in a datacenter where routine server maintenance operates on a 2-month rotation, a safe fan speed can be determined to identify fans likely to fail within the next cycle (e.g., two months) or two cycles (e.g., four months) of routine maintenance. In some cases, the safe fan speed can be based on a maintenance operators' ability to attend to fan replacements. For example, in a datacenter with the maintenance operators working with a 24-42 hour lead time for new maintenance needs, the safe fan speed can be determined to identify fans likely to fail outside of that time frame. For example, a safe fan speed can be determined to identify fans likely to fail within the next 72 hours of operation.

The safe fan speed can be determined by various techniques, such as through one or more lookup tables or one or more formulas. The safe fan speed can be determined from the fan's duty cycle. As the fan's duty cycle changes, that fan's safe fan speed may be updated. In an example, a management controller can receive the duty cycles for a set of fans in a computing device or data center, then use those duty cycles to determine individual safe fan speeds for each of the fans in the set. The management controller can then compare each of the safe fan speeds to the actual current speeds for each of the fans in the set. If any fan in the set is found to be operating at speeds below the safe fan speeds, an inference can be made that such fan(s) are likely to fail. Then, mitigation action can be performed and/or a warning can be generated for the fan(s) indicated as likely to fail. In some cases, additional information can be used to further inform or improve on the determination of a safe fan speed. For example, manufacturer information and/or model information can be determined for a fan and used along with the fan duty information to determine the fan safe speed. For example, the manufacture information and/or model information can be used to identify an appropriate lookup table to check or an appropriate formula to use.

While the techniques described herein make use of a single safe fan speed that can result in an inference of a likelihood to fail and a warning being generated, in some cases, a tiered system can make use of multiple safe fan speeds, each of which can be associated with a different tiered warning or other action. For example, when a fan's speed passes a first safe fan speed, a soft warning may be provided indicating that the fan is likely to fail within 100 hours of operation. However, if the fan's speed later passes a second safe fan speed, a hard warning may be provided indicating that the fan is likely to fail within 24 hours of operation. Any number of tiers can be used.

After comparing the current fan speed to the safe fan speed, a fan safety inference can be made as to whether or not the fan is operating in a safe condition. As used herein, the terms safe or safety when used with reference to a fan (e.g., a safe fan speed, a fan safety inference, or a safe condition) can refer to a fan's ability to operate as intended and provide adequate cooling to a computing device. When unsafe, the fan may permit the computing device to heat up undesirably, potentially resulting in damage to the computing device and/or other nearby systems. When safe, the fan may be operating as intended and may be adequately cooling the computing device or designated portion of the computing device to which the fan is associated.

If the current fan speed is at or greater than the safe fan speed, the fan safety inference can be that the fan is in a safe condition. However, if the current fan speed is less than the safe fan speed, the fan safety inference can be that the fan is in an unsafe condition. In some cases, the fan safety inference is a binary condition (e.g., safe or unsafe). In some cases, the fan safety inference can be enumerated or otherwise ranked. For example, in some cases a fan safety inference can be a number expressing a relative amount the current fan speed is below the safe fan speed. Thus, any maintenance warnings generated by the management controller can be ranked by the values of the fan safety inferences such that the more unsafe fans are replaced first.

Once a fan is determined to be in an unsafe condition, mitigation action can be taken and/or a maintenance warning can be generated. Mitigation action can involve adjusting the operation of the fan or nearby fans to compensate for the reduced fan speed. For example, the fan indicated as unsafe can be driven at a higher duty cycle to achieve a fan speed closer to the desired fan speed expected from the initial duty cycle. In some cases, numerous mitigation actions can be repeated to keep the computing system in operation as long as possible until maintenance can be performed. In some cases, after a threshold number of mitigation action or if certain other thresholds are exceeded (e.g., fan duty thresholds, fan speed thresholds, or the like), further mitigation action can be restricted and a critical warning can be issued.

A maintenance warning can be generated in response to determining a fan is in an unsafe condition. The maintenance warning can take many forms, including a message transmitted from the management controller to any suitable receiving device capable of indicating a need for maintenance. For example, the maintenance warning can include a message transmitted to a local display, a remote computer, a mobile device, or other device; which message can be displayed to a user (e.g., maintenance operator) for review and further action. When a user receives the message, the user can know to perform the indicated maintenance to replace the failing fan.

In some cases, the maintenance warning can include generating a display on a computing device associated with the failing fan. For example, a light (e.g., LED), audio speaker, display panel, or other indication device can be installed on a fan unit, a computer chassis, a rack of several computer chassis, an end unit of a set of racks, a door of a datacenter room, or otherwise. This indication device can then display information usable by a maintenance operator to identify the failing fan. For example, the indication device can be a LED light on a computer chassis containing a set number of fans and the maintenance warning can cause the LED light to blink in a pattern used to identify which of the fans has been identified as likely to fail.

Since each maintenance action results in some amount of downtime, it is desirable to minimize maintenance to minimize downtime. When it comes to fans, if a fan fails, a maintenance operator must often take the entire computing device out of service for a time to perform the fan replacement. In order to reduce such maintenance-related downtime, certain aspects of the present disclosure can be used to identify fans likely to fail within an extended period of time, thus permitting maintenance operators an opportunity to replace that likely-to-fail fan at a time when the maintenance operator is already performing maintenance on that computing device. For example, a management controller may identify that fan_2 of a certain server is likely to fail within the next two weeks. The maintenance operator may know that this same server will need to be removed for routine maintenance in about one week; thus the maintenance operator can plan ahead to replace fan_2 during that routine maintenance in one week. Thus, with the disclosed fan failure prediction, two instance of potential downtime (e.g., routine maintenance and a fan failure) are reduced to a single instance (e.g., routine maintenance with preemptive fan replacement). In a similar situation without the disclosed fan failure prediction, the server may experience downtime during routine maintenance and may experience further downtime around a week later due to failure of fan_2.

While the techniques and systems disclosed herein are made with reference to fans, such as standard computer fans, the same techniques and system scan be used, with modification, to perform failure detection of other devices driven by a duty signal for which a current speed can be measured. For example, instead of a fan, a motor-driven pump for moving cooling fluid through the computing system can be monitored for a safety inference by comparing the pump's actual speed to a safe pump speed based on the duty cycle used to drive the pump.

These illustrative examples are given to introduce the reader to the general subject matter discussed here and are not intended to limit the scope of the disclosed concepts. The following sections describe various additional features and examples with reference to the drawings in which like numerals indicate like elements. Directional descriptions are used to describe the illustrative embodiments but, like the illustrative embodiments, should not be used to limit the present disclosure. The elements included in the illustrations herein may not be drawn to scale.

FIG. 1 is a schematic top view of a computing device 100 with functional fans, according to certain aspects of the present disclosure. Computing device 100 can include a motherboard 110 supporting a pair of processing units 114, memory 112, a redundant array of inexpensive disks (RAID) controller 116, a graphics processing unit (GPU) 120, a set of hard disk drives (HDDs) 118, and a set of network interface cards (NICs) 122. The computing device 100 may contain other arrangements of components, including fewer or more components than those depicted in FIG. 1. The computing device 100 can be cooled through the use of a set of fans, including fan_0 102, fan_1 104, fan_2 106, and fan_3 108. As depicted in FIG. 1, each of the fans 102, 104, 106, 108 may be operating as intended, resulting in airflow 124 past the components of the computing device 100, thus cooling the components.

Figure 2:
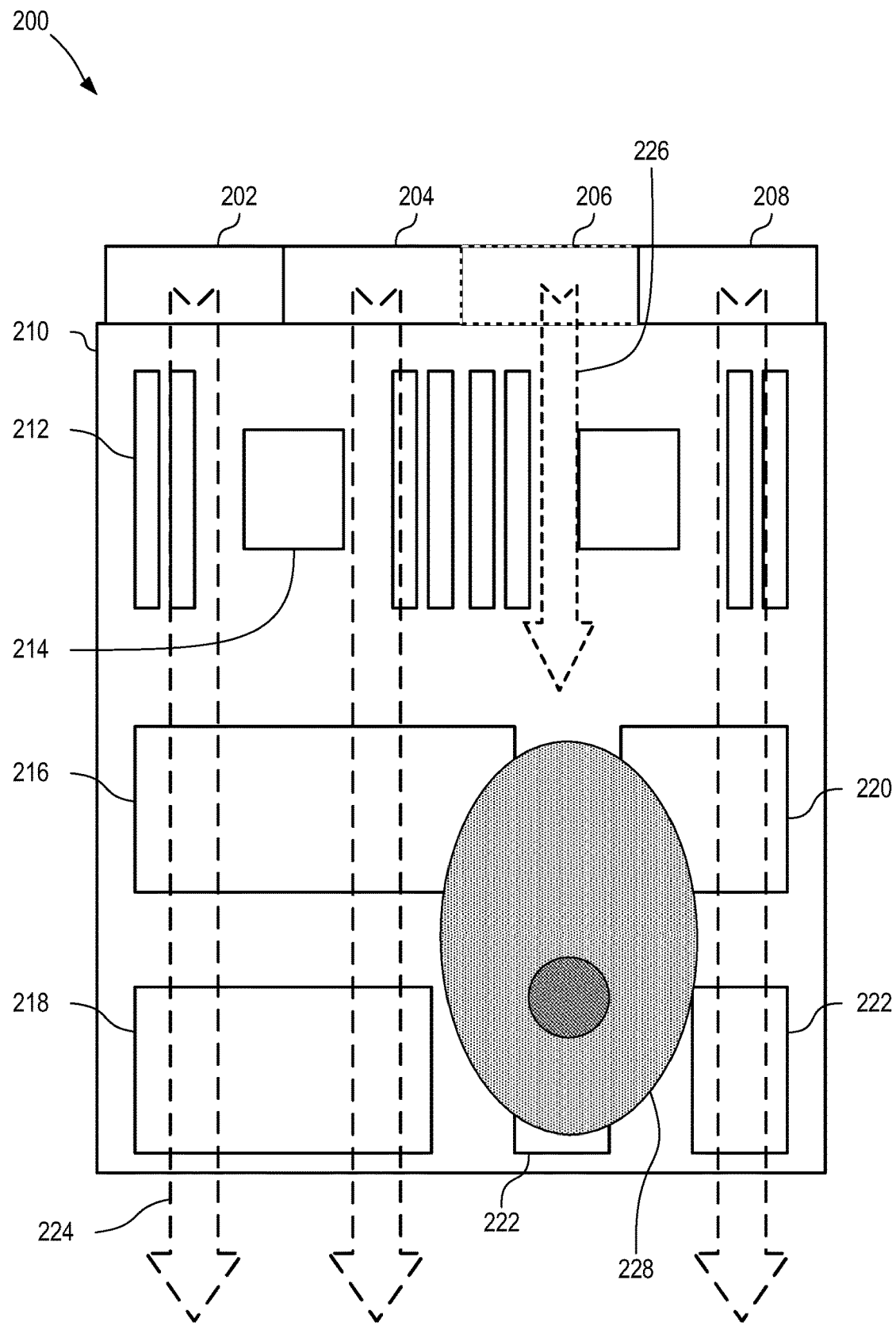
FIG. 2 is a schematic top view of a computing device with a failed fan, according to certain aspects of the present disclosure

FIG. 2 is a schematic top view of a computing device 200 with a failed fan 206, according to certain aspects of the present disclosure. The computing device 200 can be computing device 100 after fan_2 106 has failed. Computing device 200 can include a motherboard 210 supporting a pair of processing units 214, memory 212, a RAID controller 216, a GPU 220, a set of HDDs 218, and a set of NICs 222. The computing device 200 may contain other arrangements of components, including fewer or more components than those depicted in FIG. 2. The computing device 200 can be cooled through the use of a set of fans, including fan_0 202, fan_1 204, fan_2 206, and fan_3 208.

As depicted in FIG. 2, fan_2 206 is in a failure mode. While fans 202, 204, 208 operate as intended and produce the desired airflow 224, fan_2 206 is faulty and produces a faulty airflow 226. The faulty fan_2 206 may be operating at lower-than-intended speeds or may not be spinning at all. In some cases, if fan_2 206 operates at slow-enough speeds, it may cause the airflow 224 from other fans 202, 204, 208 to redirect some air out through fan_2 206 instead of out through the opposite end of the computing device 200. Overall, because fan_2 206 is in a failure mode, hotspots 228 can form within the computing device 200. Here, the NICs 222, the RAID controller 216, and the GPU 220 are all being cooled insufficiently, causing a large hotspot 228 within the computing device 200. As a result, the computing device 200 may need to be operated at reduced power or may need to be entirely removed from service until fan_2 206 can be replaced.

As described herein, certain aspects and features of the present disclosure can prevent computing device 100 of FIG. 1 from entering the unsafe conditions of computing device 200 of FIG. 2 by preemptively identifying that fan_2 106 may be likely to fail, thus giving a maintenance operator an opportunity to replace fan_2 106 before it enters a failed state like fan_2 206.

Figure 3:
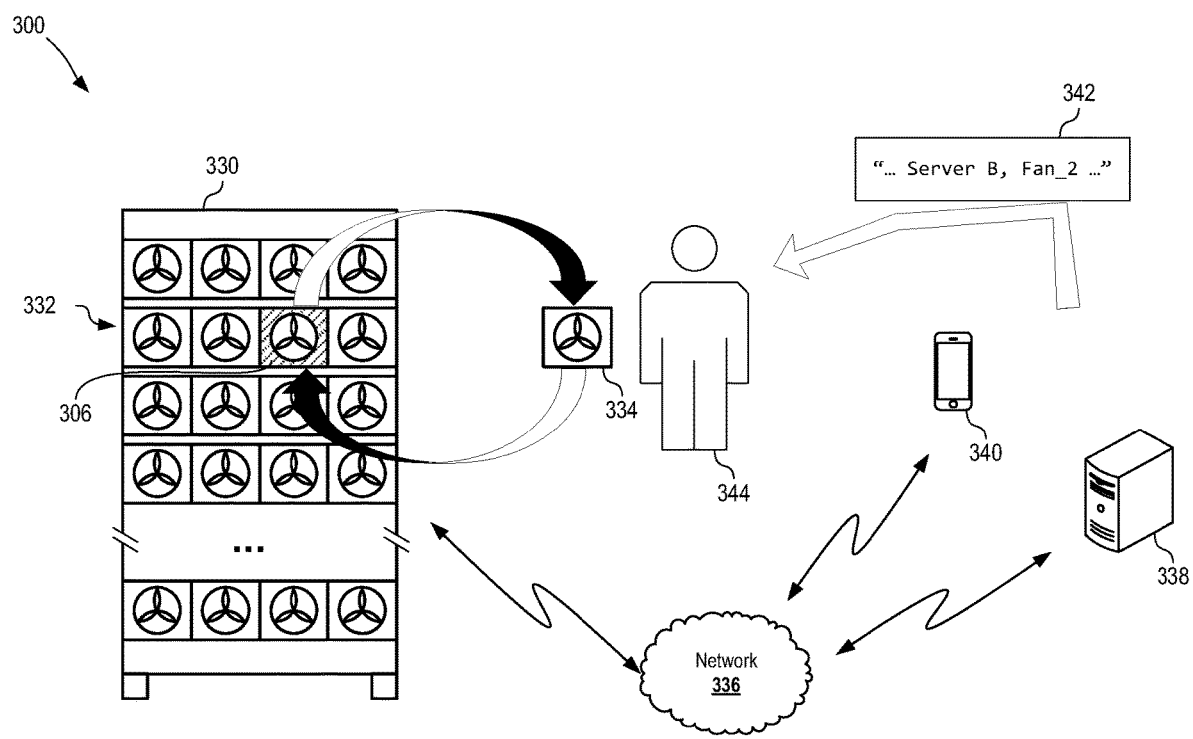
FIG. 3 is a schematic diagram depicting a computing environment for early fan failure detection and improved maintenance, according to certain aspects of the present disclosure.

FIG. 3 is a schematic diagram depicting a computing environment 300 for early fan failure detection and improved maintenance, according to certain aspects of the present disclosure. The computing environment 300 can include a rack 330 containing a number of computing devices 332, each of which can comprise a number of fan units. For example, computing device 332 can contain four fan units. Computing device 332 can be computing device 100 of FIG. 1. As depicted in FIG. 3, one of the fans of computing device 332 is a likely-to-fail fan 306. The computing device 332 can be coupled to a network 336, such as a local area network, the Internet, or a cloud network. In some cases, the computing environment 300 can include a remote computing device 338 and/or a mobile device 340 (e.g., a tablet or smartphone).

When one of the fan units of a computing device 332 is determined to be likely to fail or otherwise operating in an unsafe condition, as described herein, a maintenance warning can be generated. Monitoring of the fans and generation of the maintenance warning can be done by a controller or processor of any suitable device in the computing environment 300. The device monitoring the fans and generating the maintenance warning can be known as a management device or management controller, and can be implemented by one or more devices and/or incorporated into one or more devices of the computing environment 300, including devices not depicted in FIG. 3. In some cases, computing device 332 can generate the maintenance warning. In some cases, a remote computing device 338 or a mobile device 340 can receive fan duty information and current fan speed information from the computing device 332 via a network 336, can determine that fan 306 is likely to fail, and can generate the maintenance warning. In some cases, generation of a maintenance warning can result in a message being transmitted to and/or displayed on the remote computing device 338 and/or mobile device 340, such as through network 336.

In some cases, the maintenance warning can include a message 342, readable by a user 344, that indicates the location or relative location of the likely-to-fail fan 306. As depicted in FIG. 3, the message 342 indicates that the likely-to-fail fan 306 is in "Server B" and in the "Fan_2" position. In some cases, the message 342 can include other information, such as the estimated time until fan failure or other such information. The message 342 can be an indication that the likely-to-fail fan 306 must be replaced. Thus, the user 344 can obtain a replacement fan 334 and go about replacing the likely-to-fail fan 306 with the replacement fan 334. The actual replacement of the likely-to-fail fan 306 can occur immediately upon receipt of the message 324, sometime after receipt of the message 342, or upon the next scheduled maintenance of the computing device 332. In some cases, as described herein, generation of a maintenance warning can include presenting an indication of the likely-to-fail fan 306 in other ways, such as through a chassis LED on computing device 332.

Figure 4:
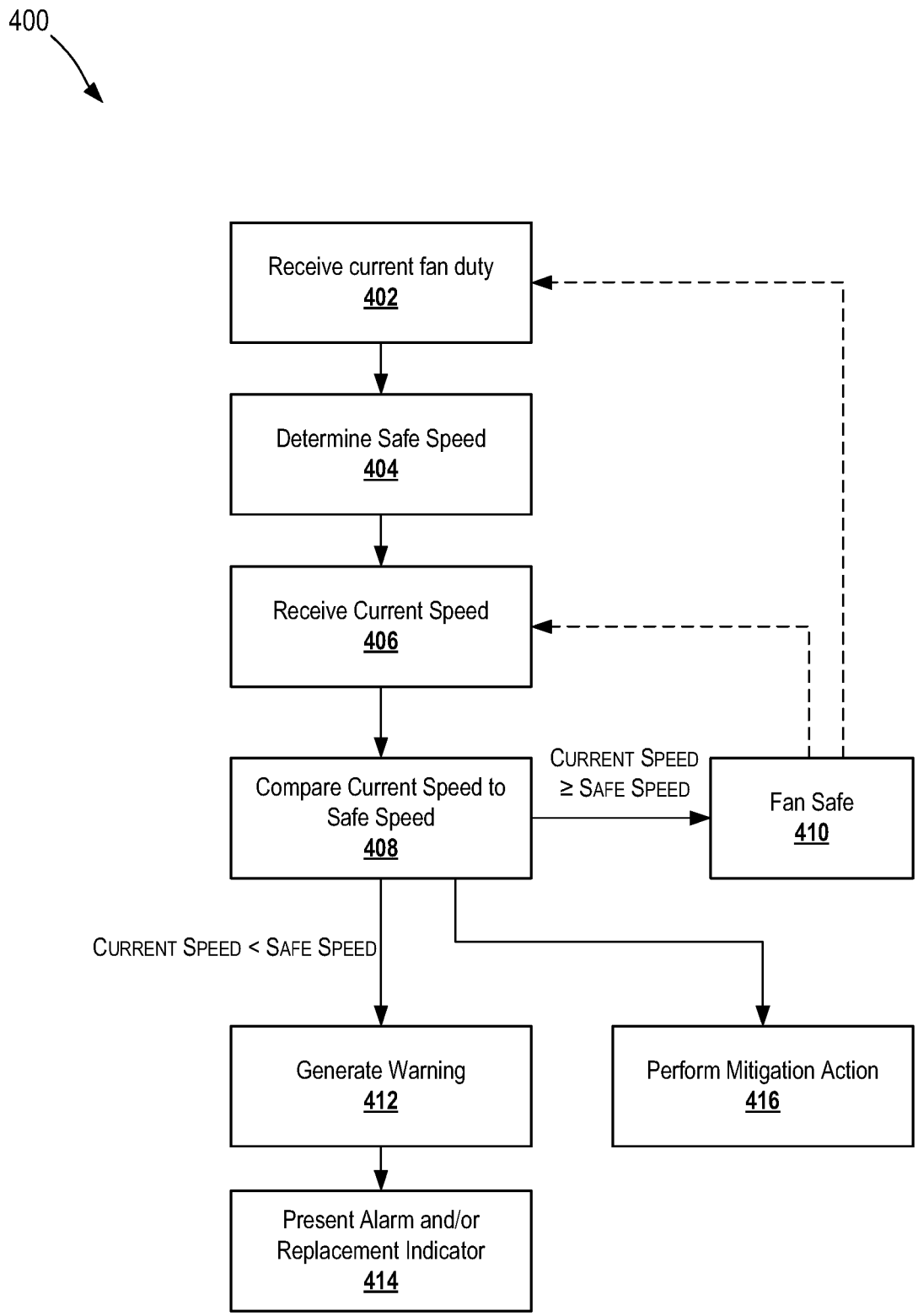
FIG. 4 is a flowchart depicting a process for fan failure detection, according to certain aspects of the present disclosure.

FIG. 4 is a flowchart depicting a process 400 for fan failure detection, according to certain aspects of the present disclosure. Process 400 can be performed for fans of a computing device, such as computing device 100 of FIG. 1. Process 400 can be performed on the computing device containing the fans to be monitored, or on another device. Process 400, as well as individual blocks of process 400, can be performed simultaneously or sequentially for any number of fans or fan zones.

At block 402, the current fan duty is received. Receiving the current fan duty can include retrieving the fan duty setting for the fan, monitoring the PWM signal driving the fan, and/or remotely receiving a transmission containing the fan duty setting of the fan (e.g., receiving at a remote computing device a transmission from the computing device containing the fan). In some cases, receiving the current fan duty at block 402 can occur each time the fan duty is adjusted or can occur as regular intervals.

At block 404, a safe speed for the fan is determined using the received fan duty from block 402. The safe speed can be a particular number of revolutions per minute (RPM) below which a fan can be determined to be likely to fail within a predetermined amount of time. In some cases, determining the safe speed can include applying the current fan duty to a formula to calculate the safe speed. In some cases, determining the safe speed can include applying the current fan duty to a lookup table to identify the safe speed. In some cases, determining the safe speed at block 404 can include selecting a technique for determining the safe speed. In some cases, selecting the technique for determining the safe speed can include using additional information associated with the fan or the computing device associated with the fan. For example, manufacturer and/or model information of the fan and/or thermal design information of the computing device can be used to determine the safe speed at block 404.

In some cases, determining the safe fan speed at block 404 can include applying a tolerance modifier to an initial safe fan speed determined through a lookup table search or formula calculation. In some cases, the tolerance modifier can be preset or user-set.

At block 406, the current speed of the fan is received. Receiving the current fan speed can include retrieving a fan speed signal from the fan, externally monitoring the speed of the fan (e.g., with a separate tachometer), and/or remotely receiving a transmission containing the measured fan speed of the fan (e.g., receiving at a remote computing device a transmission from the computing device containing the fan). In some cases, receiving the current fan speed at block 406 can occur at regular intervals and/or each time the fan speed changes by more than a threshold amount (e.g., 1%, 2%, 3%, 4%, 5%, 6%, 7%, 8%, 9%, and/or 10%).

At block 408, the current speed of the fan received at block 406 is compared to the safe speed determined at block 404. If the current speed is at or greater than the safe speed, an inference can be generated that the fan is safe or otherwise operating as intended. At block 410, once a safe inference is made, the process 400 can repeat from block 402 or block 406. Repeating from block 402 would result in receiving the fan duty information again, permitting the safe speed to be updated if the fan is now being driven at a different fan duty. However, repeating from block 406 can permit the process 400 to repeat more quickly and using fewer resources if it is likely that the fan is still operating at the same fan duty. Therefore, in some cases, a determination can be made at block 410 to continue from block 402 or block 406 based on a likelihood that the fan is operating at the same fan duty. For example, this determination can be based on the amount of time that has elapsed since the last time block 402 was performed for this fan or can be based on other information.

However, if the current speed is less than the safe speed when compared at block 408, an inference can be made that the fan is unsafe, operating in an unsafe condition, or otherwise likely to fail. When the fan safety inference is that the fan is unsafe, the process 400 can continue by generating a maintenance warning at block 412 and/or performing a mitigation action at block 416.

Performing a mitigation action at block 416 can include various techniques to improve cooling of the computing device containing the fan until the fan can be replaced. Such actions can include driving the fan and/or surrounding fans at higher fan duties until replacement occurs.

Generation of a warning at block 412 can include generating a warning message and/or transmission that can be displayed and/or communicated to another device such that a user can be notified that the fan is likely to fail. In some cases, a message can be transmitted to a user immediately. In some cases, a line item to replace the likely-to-fail fan can be appended to a list of maintenance tasks to be completed at some time in the future. Generation of the warning at block 412 results in replacement of the likely-to-fail fan, preferably before the fan actually fails or reaches a point of substantially affecting operation of the computing device associated with the fan.

In some cases, generation of a warning can result in presenting an alarm and/or replacement indicator at block 414. The alarm and/or replacement indicator can include displaying a visual indication or presenting an auditory indication that is indicative of a likely-to-fail fan. In some cases, the alarm and/or replacement indicator can present information indicative of the location and/or a relative location (e.g., relative location of the fan within a chassis) of the likely-to-fail fan. For example, a replacement indicator providing a location of a likely-to-fail fan may provide a display that says "Fan_2 of Server B" must be replaced. In an example of a replacement indicator providing a relative location of the likely-to-fail fan, a chassis LED of a server may blink in a pattern indicating that the fan in the "Fan_2" position of that chassis is likely-to-fail.

Figure 5:
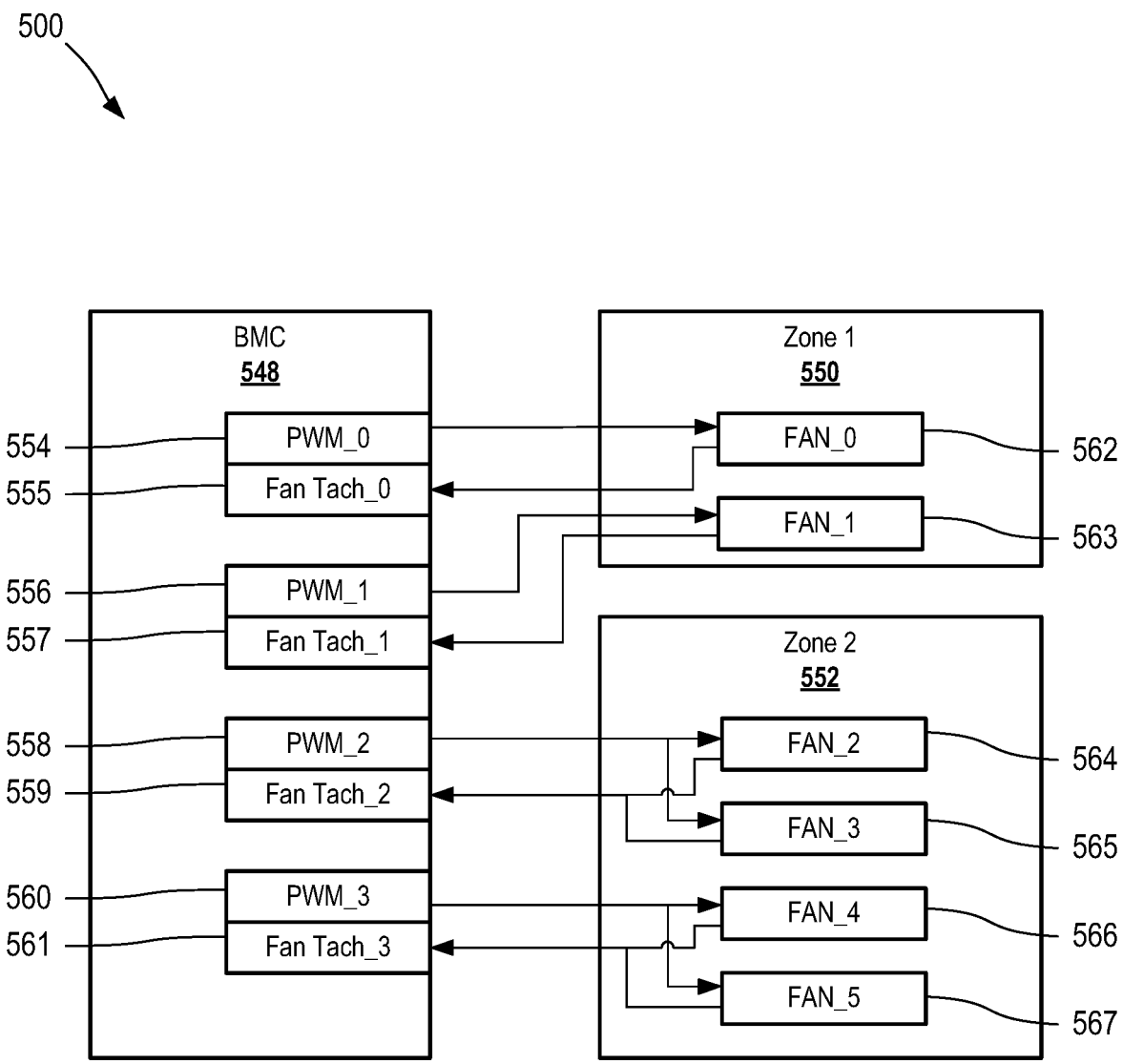
FIG. 5 is a schematic diagram of a computing device having multiple fan zones, according to certain aspects of the present disclosure.

FIG. 5 is a schematic diagram of a computing device 500 having multiple fan zones, according to certain aspects of the present disclosure. Computing device 500 can be similar to computing device 100 of FIG. 1. The computing device 500 can include a BMC 548 that provides for control and monitoring of six fans across two fan zones, including FAN_0 562 and FAN_1 563 in Zone 1 550 and FAN_2 564, FAN_3 565, FAN_4 566, and FAN_5 567 in Zone 2 552, using a set of PWM outputs and a set of Fan Tachometer signal inputs.

For Zone 1 550, the BMC 548 provides fan duty driving signals to FAN_0 562 and FAN_1 563 via outputs PWM_0 554 and PWM_1 556, respectively. The BMC 548 receives fan speed information from FAN_0 562 and FAN_1 563 via inputs Fan Tach_0 555 and Fan Tach_1 557, respectively.

For Zone 2 552, the BMC 548 provides fan duty driving signals to FAN_2 564 and FAN_3 565 via output PWM_2 558, receives fan speed information from these fans via input Fan Tach_2 559, provides fan duty driving signals to FAN_4 566 and FAN_5 567 via output PWM_3 560 and receives fan speed information from these fans via input Fan Tach_3 561.

As depicted in FIG. 5, the computing device 500 is implemented according to the arrangement described above, although other arrangements with any number of fans, fan zones, inputs, outputs, and/or controllers can be used.

Obtaining a fan duty can involve accessing data from a fan control register or a setting history on a management controller or firmware in the system, such as via the BMC 548. In some cases, fan duty can be otherwise stored or accessed. Likewise, accessing fan speed can include receiving fan speed information via the BMC 548, such as directly from the BMC 548 or from a storage location where the fan speed information is otherwise stored. In some cases, fan duty information and fan speed information can be provided externally, such as through an external database of fan duties or an external tachometer measuring fan speeds.

In some cases, the use of fan zones (e.g., zone 1 550 and zone 2 552) can be used to inform mitigation actions. For example, if FAN_0 562 had been identified as likely to fail, a mitigation action can be performed to increase the speed of other fans in Zone 1 550, namely FAN_1 563, to compensate for the reduced performance of FAN_0 562.

In some cases, multiple fans can be run from a single output and/or be monitored by a single input, such as FAN_2 564 and FAN_3 565. In such cases, the multiple fans can be treated as a single fan for the purposes of fan failure detection. Thus, if the grouping of fans being driven by the output PWM_2 558 and monitored by the input Fan Tach_2 559 are showing that the current speed is below the safe speed for that duty cycle, that grouping of fans can be indicated as likely to fail, regardless of the number of fans in that grouping. In some cases, multiplexing of driving signal outputs and/or sensing signal inputs can be used to maintain monitoring and prediction of individual fans, regardless of the number of fans coupled to a single input and/or output.

Figure 6:
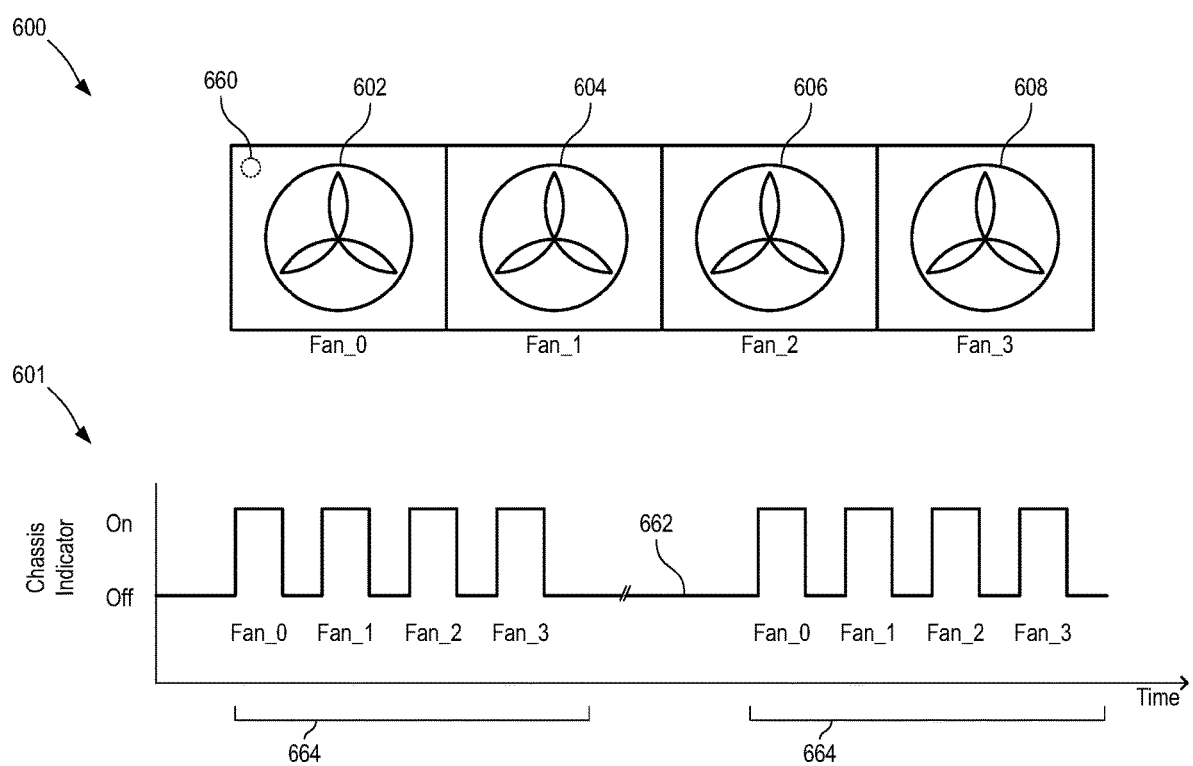
FIG. 6 is a combination schematic diagram and chart depicting a computing device with four fans and a lighting pattern of a chassis indicator, according to certain aspects of the present disclosure.

FIG. 6 is a combination schematic diagram and chart depicting a computing device 600 with four fans and a lighting pattern 601 of a chassis indicator, according to certain aspects of the present disclosure. The computing device 600 can be computing device 100 of FIG. 1. As depicted in FIG. 6, the computing device 600 can include multiple fans, including Fan_0 602, Fan_1 604, Fan_2 606, and Fan_3 608. Each of these fans is operating in safe conditions, as determined according to certain aspects of the present disclosure, such as process 400 of FIG. 4. The computing device 600 can also include a chassis indicator 660, shown in dotted line to indicate its position on the opposite side of the device from the side shown in FIG. 6. The chassis indicator 660 can be located anywhere on the chassis where it would be readily visible to a user. While described herein with reference to a chassis indicator, it is understood that any other indicator can be used.

The chassis indicator 660 can be driven to illuminate and go dark according to the lighting pattern 601. Line 662 indicates when the chassis indicator light is illuminated or turned off. Since all four fans are operating in safe conditions, line 662 shows that the chassis indicator light is illuminated four separate times during each repeated display period 664, once for each of the safe fans. Thus, a user viewing the chassis would see a repeating pattern of "[On-Off]-[On-Off]-[On-Off]-[On-Off]," indicative that all four fans are operating under safe conditions. Any other suitable, recognizable patterns can be used.

Figure 7:
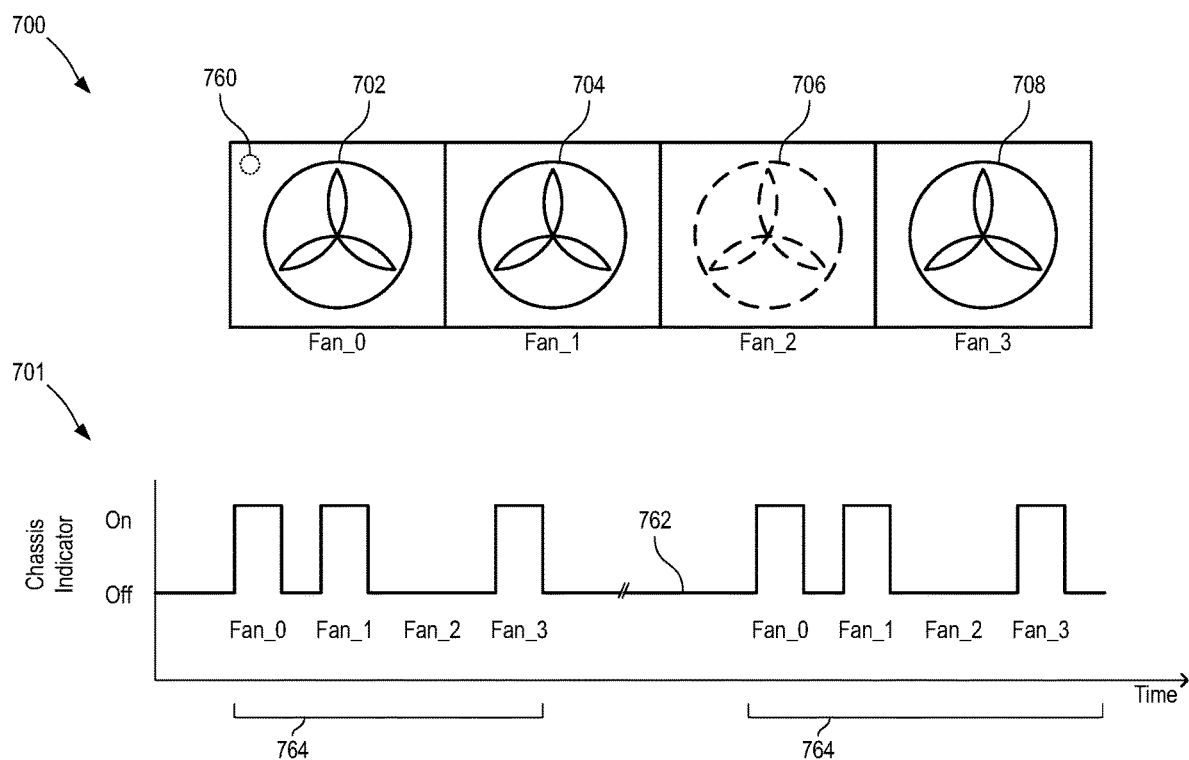
FIG. 7 is a combination schematic diagram and chart depicting a computing device with four fans and a lighting pattern of a chassis indicator when one of the fans is a failed fan, according to certain aspects of the present disclosure.

FIG. 7 is a combination schematic diagram and chart depicting a computing device 700 with four fans and a lighting pattern 701 of a chassis indicator when one of the fans is a failed fan, according to certain aspects of the present disclosure. The computing device 700 can be computing device 600 of FIG. 6 after Fan_2 606 has entered an unsafe condition or is otherwise likely to fail. As depicted in FIG. 7, the computing device 700 can include multiple fans, including Fan_0 702, Fan_1 704, Fan_2 706, and Fan_3 708. Each of these fans is operating in safe conditions, as determined according to certain aspects of the present disclosure, such as process 400 of FIG. 4, except for Fan_2 706, which is determined to be operating in unsafe conditions. The computing device 700 can also include a chassis indicator 760, shown in dotted line to indicate its position on the opposite side of the device from the side shown in FIG. 7. The chassis indictor 760 can be located anywhere on the chassis where it would be readily visible to a user. While described herein with reference to a chassis indicator, it is understood that any other indicator can be used.

The chassis indicator 760 can be driven to illuminate and go dark according to the lighting pattern 701. Line 762 indicates when the chassis indicator light is illuminated or turned off. Since Fan_0 702, Fan_1 704, and Fan_3 708 are operating in safe conditions and Fan_2 706 is operating in an unsafe condition, line 762 shows that the chassis indicator light is illuminated twice, remains off once, and illuminated a last time during each repeated display period 764. Thus, a user viewing the chassis would see a repeating pattern of "[On-Off]-[On-Off]-[Off-Off]-[On-Off]," indicative that the first, second, and fourth fans are operating under safe conditions, but that the third fan (e.g., Fan_2 706) is likely to fail and should be replaced. Any other suitable, recognizable patterns can be used to indicate the relative position of the fan to be replaced.

Figure 8:
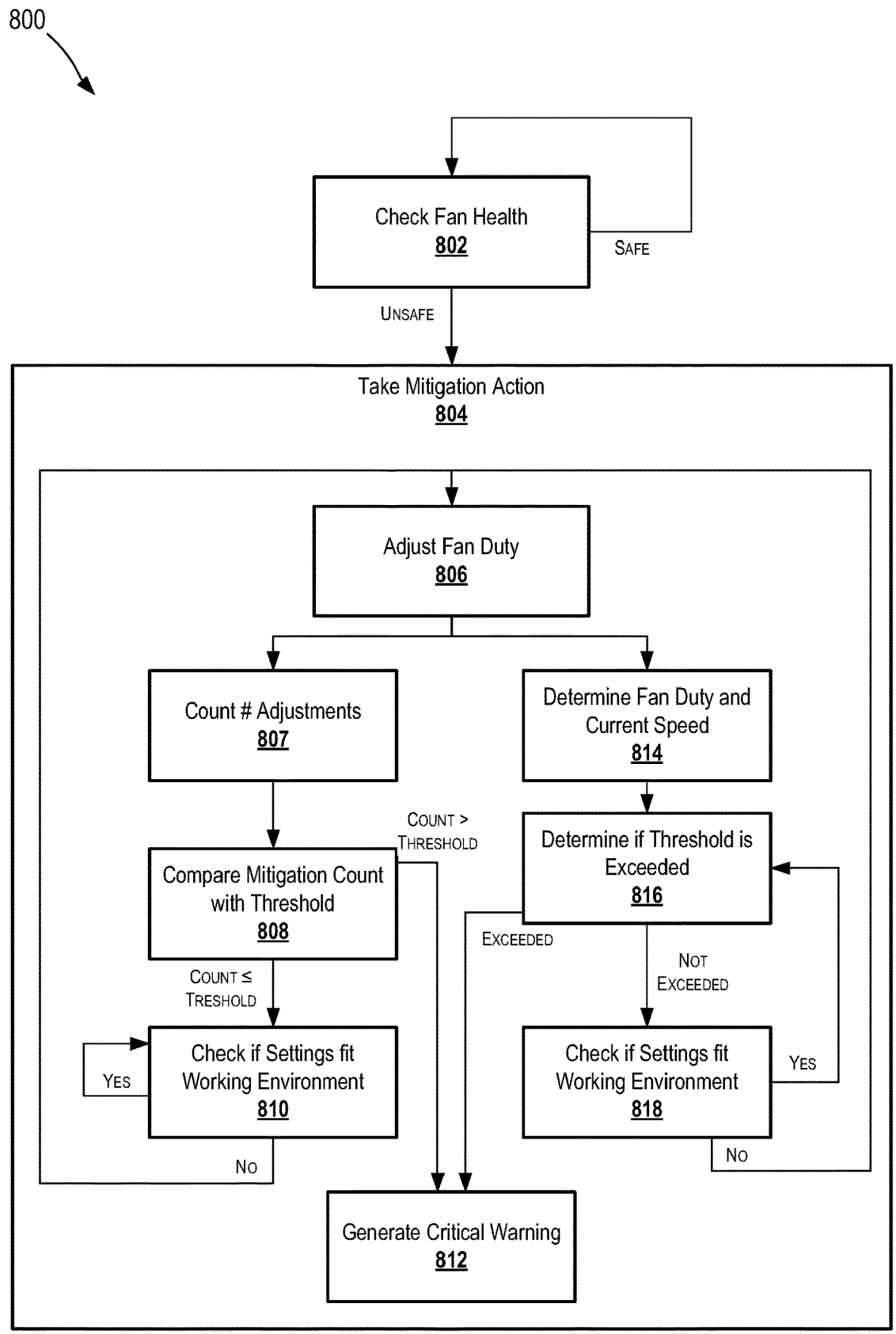
FIG. 8 is a flowchart depicting a process for fan failure detection with mitigation, according to certain aspects of the present disclosure.

FIG. 8 is a flowchart depicting a process 800 for fan failure detection with mitigation, according to certain aspects of the present disclosure. Checking fan health at block 802 can include performing various blocks from process 400 of FIG. 4, and taking mitigation action at block 804 can include performing mitigation actions from block 416 of FIG. 4.

At block 802, fan health can be checked. Fan health can be checked by determining a safe speed for the fan and comparing the safe speed to a current speed. If the current speed is at or greater than the safe speed, the fan health can be determined to be safe, and the process 800 can continue by checking fan health again at block 802. However, if the current speed is less than the safe speed, the fan health can be determined to be unsafe (e.g., likely to fail) and the process 800 can continue by taking mitigation action at block 804. Mitigation action at block 804 can occur on the fan identified as unsafe and/or on surrounding fans (e.g., other fans in the same fan zone as the fan identified as unsafe).

Taking mitigation action at block 804 can include adjusting fan duty at block 806. Adjusting fan duty at block 806 can include adjusting a setting for the fan duty being used to drive the fan and/or can include transmitting a signal to a computing device, which signal results in adjustment of the fan duty being used to drive the fan. Adjusting the fan duty at block 806 can include increasing the fan duty to attempt to increase the speed of the fan.

After adjusting the fan duty at block 806, taking mitigation action can continue down one or both paths of action shown with in relation to blocks 807 and 814.

At block 807, the number of times the fan duty has been adjusted at block 806 can be counted. This count can be compared to a threshold amount at block 808. If the count exceeds the threshold amount, a critical warning can be generated at block 812. The count exceeding the threshold amount can represent an instance where the fan duty has been adjusted so many times that an inference is made that it should not be adjusted further, and thus the critical warning can be generated.

If the count of adjustments (e.g., mitigation count) from block 807 does not exceed the threshold, then the process 800 can continue to check if the current settings (e.g., adjusted fan duty) fit the working environment (e.g., the computing device's thermal requirements) at block 810. If the current settings do fit the working environment at block 810, the process 800 can optionally revert back to checking fan health at block 802, or can optionally continue checking to see if the settings fit the working environment at block 810. However, if the current settings do not fit the working environment, the process 800 can continue by further adjusting the fan duty at block 806.

In addition to or alternate to counting adjustments at block 807, the current fan duty and/or current fan speed can be determined at block 814. This fan duty and/or current speed information can be compared at block 816 to see if any threshold levels are exceeded, such as fan duty thresholds and/or fan speed thresholds. If a threshold is exceeded, a critical warning can be generated at block 812. However, if no threshold is exceeded, the process 800 can continue to check if the current settings (e.g., adjusted fan duty) fit the working environment (e.g., the computing device's thermal requirements) at block 818. If the current settings do fit the working environment at block 818, the process 800 can optionally revert back to checking fan health at block 802, or can optionally continue checking to see if any thresholds are exceeded at block 816. However, if the current settings do not fit the working environment, the process 800 can continue by further adjusting the fan duty at block 806.

Generating the critical warning at block 812 can include generating a message indicating that no further mitigation action will be or can be taken. In some cases, generating the critical warning at block 812 can also include taking final actions, such as reducing the power of the computing device to reduce heat generation or shutting the computing device down to avoid thermal damage.

In some cases, taking mitigation action at block 804 can include more or fewer elements.

Figure 9:
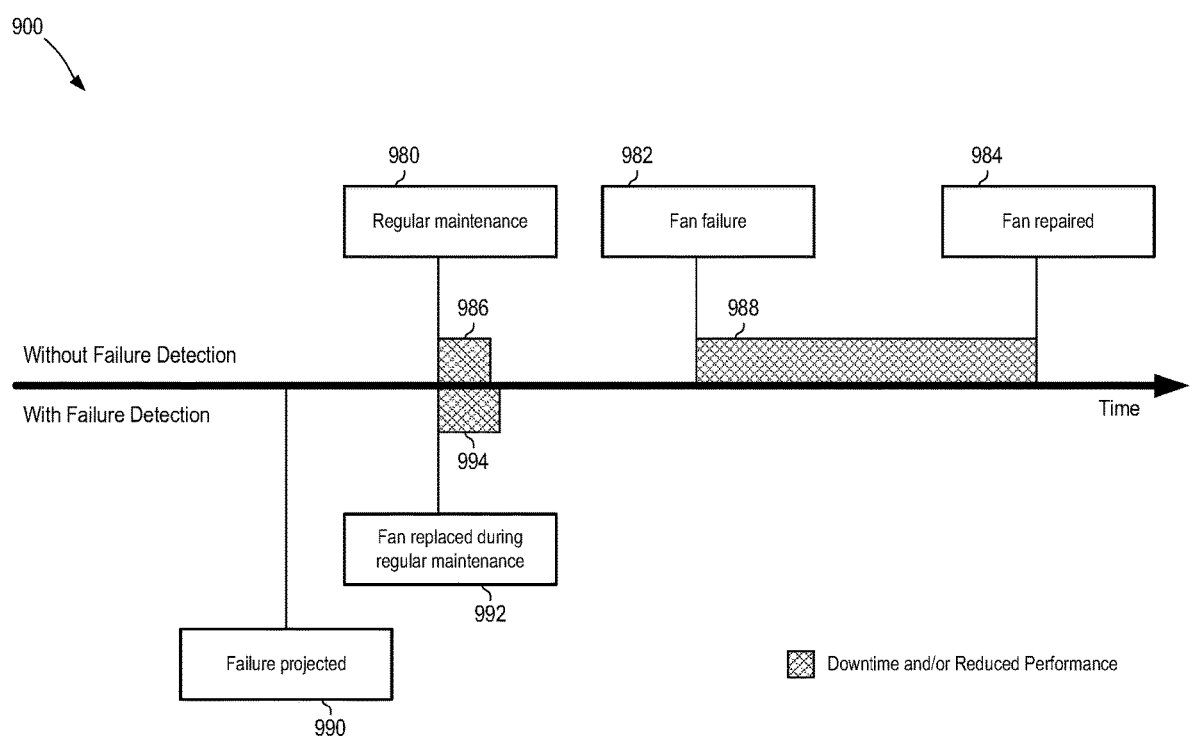
FIG. 9 is a chart comparing downtime of a computing system without and with failure detection, according to certain aspects of the present disclosure.

FIG. 9 is a chart 900 comparing downtime of a computing system without and with failure detection, according to certain aspects of the present disclosure. Chart 900 includes a timeline, a depiction of server downtime above the timeline for a system without fan failure detection, and depiction of server downtime below the timeline for the same when fan failure detection is used according to certain aspects of the present disclosure. The computing system of FIG. 9 may be computing device 100 of FIG. 1.

Regardless of fan failure detection, the system may be scheduled to undergo regular maintenance at the same time. However, when fan failure detection is used, future fan failures can be anticipated, permitting fan replacement to occur during routine maintenance, thus decreasing overall server downtime.

When fan failure detection is not used, the system may under routine maintenance at time 980, resulting in a period of downtime 986 associated with routine maintenance. At some time in the future, a fan may fail at time 982, resulting in a period of downtime 988 until the fan can be repaired at time 984. The period of downtime 988 may be in the form of reduced performance for the server or may be complete downtime if the server must be powered off until the fan can be replaced. The duration of the period of downtime 988 may be especially long if the working schedules for personnel able to perform the fan replacement are busy and thus the personnel are unable to attend to the replacement immediately.

However, with fan failure detection, the failure of that fan can be projected at time 990, which can be in advance of the routine maintenance at time 992. Since the fan failure was projected in advance, the fan can be replaced during the routine maintenance at time 992. The period of downtime 994 associated with the routine maintenance and fan replacement at time 992 may be approximately the same or only minimally longer than the period of downtime 986 associated with just routine maintenance alone. However, because the likely-to-fail fan was replaced at time 992, that fan does not undergo failure in the future at time 982, and thus the subsequent period of downtime 988, which may be long, can be entirely avoided.

Figure 10:
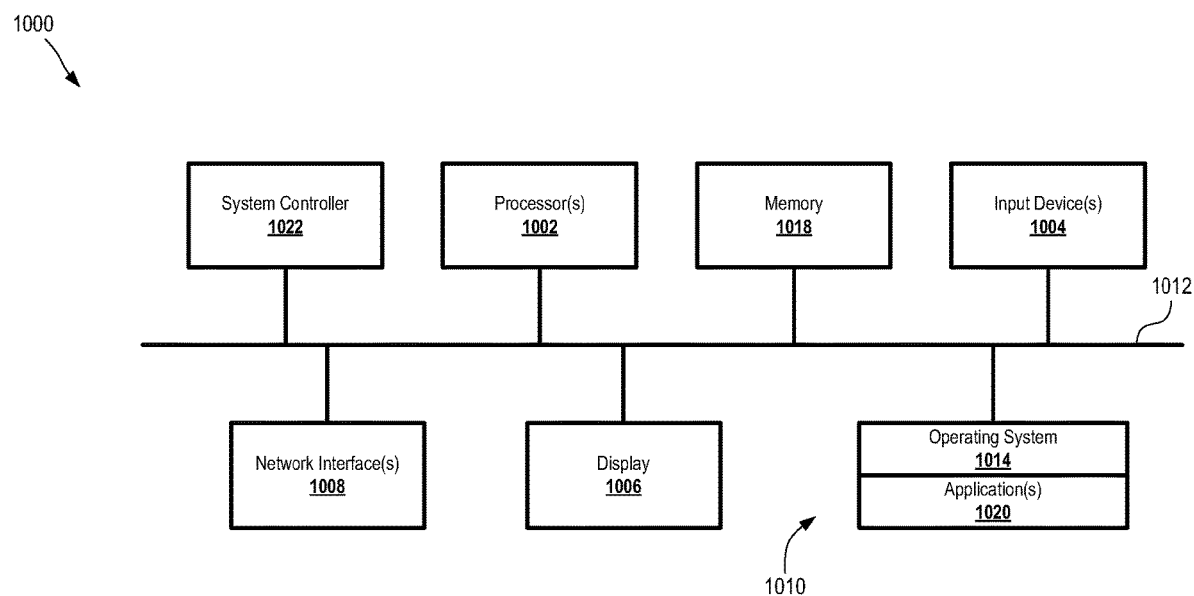
FIG. 10 is a block diagram of an example system architecture for implementing features and processes, according to certain aspects of the present disclosure.

FIG. 10 is a block diagram of an example system architecture for implementing features and processes of the present disclosure, such as those presented with reference to FIGS. 1-9. The system architecture 1000 can be implemented on any electronic device that runs software applications derived from compiled instructions, including without limitation, personal computers, servers, smart phones, media players, electronic tablets, game consoles, email devices, and the like. In some implementations, the system architecture 1000 can include one or more processors 1002, one or more input devices 1004, one or more display devices 1006, one or more network interfaces 1008, and one or more computer-readable mediums 1010. Each of these components can be coupled by bus 1012.

In some implementations, the system architecture 1000 can correspond to a single server in a rack of servers. Various rack configurations can be implemented. For example, a rack can include multiple chassis and each chassis can contain multiple servers. Each server in the rack can be connected by various hardware components (e.g., backbone, middle plane, etc.).

Display device 1006 can be any known display technology, including but not limited to display devices using Liquid Crystal Display (LCD) or Light Emitting Diode (LED) technology. Processor(s) 1002 can use any known processor technology, including but not limited to graphics processors and multi-core processors. Input device 1004 can be any known input device technology, including but not limited to a keyboard (including a virtual keyboard), mouse, track ball, and touch-sensitive pad or display. Bus 1012 can be any known internal or external bus technology, including but not limited to ISA, EISA, PCI, PCI Express, NuBus, USB, Serial ATA or FireWire.

Computer-readable medium 1010 can be any medium that participates in providing instructions to processor(s) 1002 for execution, including without limitation, non-volatile storage media (e.g., optical disks, magnetic disks, flash drives, etc.) or volatile media (e.g., SDRAM, ROM, etc.). The computer-readable medium (e.g., storage devices, mediums, and memories) can include, for example, a cable or wireless signal containing a bit stream and the like. However, when mentioned, non-transitory computer-readable storage media expressly exclude media such as energy, carrier signals, electromagnetic waves, and signals per se.

Computer-readable medium 1010 can include various instructions for implementing operating system 1014 and applications 1020 such as computer programs. The operating system can be multi-user, multiprocessing, multitasking, multithreading, real-time and the like. The operating system 1014 performs basic tasks, including but not limited to: recognizing input from input device 1004; sending output to display device 1006; keeping track of files and directories on computer-readable medium 1010; controlling peripheral devices (e.g., disk drives, printers, etc.) which can be controlled directly or through an I/O controller; and managing traffic on bus 1012. Computer-readable medium 1010 can include various instructions for implementing firmware processes, such as a BIOS. Computer-readable medium 1010 can include various instructions for implementing any of processes described herein, including at least processes 400, 800 of FIGS. 4, 8, respectively.

Memory 1018 can include high-speed random access memory and/or non-volatile memory, such as one or more magnetic disk storage devices, one or more optical storage devices, and/or flash memory (e.g., NAND, NOR). The memory 1018 (e.g., computer-readable storage devices, mediums, and memories) can include a cable or wireless signal containing a bit stream and the like. However, when mentioned, non-transitory computer-readable storage media expressly exclude media such as energy, carrier signals, electromagnetic waves, and signals per se. The memory 1018 can store an operating system, such as Darwin, RTXC, LINUX, UNIX, OS X, WINDOWS, or an embedded operating system such as VxWorks.

System controller 1022 can be a service processor that operates independently of processor 1002. In some implementations, system controller 1022 can be a baseboard management controller (BMC). For example, a BMC is a specialized service processor that monitors the physical state of a computer, network server, or other hardware device using sensors and communicating with the system administrator through an independent connection. The BMC is configured on the motherboard or main circuit board of the device to be monitored. The sensors of a BMC can measure internal physical variables such as temperature, humidity, power-supply voltage, fan speeds, communications parameters, and operating system (OS) functions.

In some implementations, the BMC runs independently of processor 1002 and hence in the event of processor 1002, memory 1018 or any other hardware failure, the BMC can still provide services and remain functional. In some implementations, the BMC can start running as soon as a server is plugged into a power source (e.g., power supply unit, backup power unit, power distribution unit, etc.). For example, the power button on the front side of the blade does not turn on/off the BMC.

The described features can be implemented advantageously in one or more computer programs that are executable on a programmable system including at least one programmable processor coupled to receive data and instructions from—and to transmit data and instructions to—a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computing system that includes a back-end component, such as a data server, or that includes a middleware component, such as an application server or an Internet server, or that includes a front-end component, such as a client computer having a graphical user interface or an Internet browser, or any combination thereof. The components of the system can be connected by any form or medium of digital data communication such as a communication network. Examples of communication networks include, e.g., a LAN, a WAN, and the computers and networks forming the Internet.

The computing system can include clients and servers. A client and server are generally remote from each other and typically interact through a network. The relationship of client and server arises by virtue of computer programs running on the respective computers and having a client-server relationship to each other.

One or more features or steps of the disclosed embodiments can be implemented using an application programming interface (API). An API can define one or more parameters that are passed between a calling application and other software code (e.g., an operating system, library routine, function) that provides a service, that provides data, or that performs an operation or a computation.

The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer will employ to access functions supporting the API.

In some implementations, an API call can report to an application the capabilities of a device running the application, such as input capability, output capability, processing capability, power capability, communications capability, and the like.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

The above description is provided in relation to various examples which may share one or more common characteristics and/or features. It is to be understood that one or more features of any one example may be combinable with one or more features of another example or other examples. In addition, any single feature or combination of features in any of the examples may constitute a further example.

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A system, comprising:
   one or more data processors; and
   a non-transitory computer-readable storage medium containing instructions which, when executed on the one or more data processors, cause the one or more data processors to perform operations including:
   receiving fan duty information associated with a fan of a computing device having a plurality of fan positions and a chassis indicator light, the fan being installed at one of the plurality of fan positions;
   determining a safe fan speed associated with the fan using the received fan duty information;
   receiving a current fan speed associated with the fan;
   generating a fan safety inference using the current fan speed and the safe fan speed, wherein generating the fan safety inference comprises comparing the current fan speed with the safe fan speed;
   generating a maintenance warning when the fan safety inference is indicative of an unsafe condition; and
   transmitting the maintenance warning to the computing device, wherein the maintenance warning, when received by the computing device, causes the computing device to output a visual indication of the fan position of the computing device in which the fan is installed, and wherein outputting the visual indication includes driving the chassis indicator light using one of a plurality of lighting patterns, wherein the plurality of lighting patterns includes a unique lighting pattern for each of the plurality of fan positions, and wherein the one of the plurality of lighting patterns is associated with the fan position in which the fan is installed.

2. The system of claim 1, wherein the fan safety inference is indicative of the unsafe condition when the current fan speed is lower than the safe fan speed.

3. The system of claim 1, wherein determining the safe fan speed comprises applying the received fan duty information to a lookup table to identify a safe fan speed.

4. The system of claim 1, wherein receiving the fan duty information associated with the fan of the computing device comprises receiving the fan duty information through a network interface.

5. The system of claim 1, wherein the operations further comprise taking a mitigation action when the fan safety inference is indicative of an unsafe condition, wherein taking the mitigation action includes adjusting a fan duty used to drive the fan or an alternate fan of the computing device.

6. The system of claim 5, wherein the operations further comprise:
taking one or more additional mitigation actions associated with the fan or another fan of the computing device;
calculating a total number of mitigation actions taken in association with the computing device, wherein the total number of mitigation actions taken includes the mitigation action and the one or more additional mitigation actions;
determining that the total number of mitigation actions exceeds a threshold; and
restricting further mitigation action and issuing a critical warning in response to determining that total number of mitigation actions exceeds a threshold.

7. A computer-implemented method, comprising:
receiving fan duty information associated with a fan of a computing device having a plurality of fan positions and a chassis indicator light, the fan being installed at one of the plurality of fan positions;
determining a safe fan speed associated with the fan using the received fan duty information;
receiving a current fan speed associated with the fan;
generating a fan safety inference using the current fan speed and the safe fan speed, wherein generating the fan safety inference comprises comparing the current fan speed with the safe fan speed;
generating a maintenance warning when the fan safety inference is indicative of an unsafe condition; and
transmitting the maintenance warning to the computing device, wherein the maintenance warning, when received by the computing device, causes the computing device to output a visual indication of the fan position of the computing device in which the fan is installed, and wherein outputting the visual indication includes driving the chassis indicator light using one of a plurality of lighting patterns, wherein the plurality of lighting patterns includes a unique lighting pattern for each of the plurality of fan positions, and wherein the one of the plurality of lighting patterns is associated with the fan position in which the fan is installed.

8. The method of claim 7, wherein the fan safety inference is indicative of the unsafe condition when the current fan speed is lower than the safe fan speed.

9. The method of claim 7, wherein determining the safe fan speed comprises applying the received fan duty information to a lookup table to identify a safe fan speed.

10. The method of claim 7, wherein receiving the fan duty information associated with the fan of the computing device comprises receiving the fan duty information through a network interface.

11. The method of claim 7, further comprising taking a mitigation action when the fan safety inference is indicative of an unsafe condition, wherein taking the mitigation action includes adjusting a fan duty used to drive the fan or an alternate fan of the computing device.

12. The method of claim 11, further comprising:
taking one or more additional mitigation actions associated with the fan or another fan of the computing device;
calculating a total number of mitigation actions taken in association with the computing device, wherein the total number of mitigation actions taken includes the mitigation action and the one or more additional mitigation actions;
determining that the total number of mitigation actions exceeds a threshold; and
restricting further mitigation action and issuing a critical warning in response to determining that total number of mitigation actions exceeds a threshold.

13. A computer-program product tangibly embodied in a non-transitory machine-readable storage medium, including instructions configured to cause a data processing apparatus to perform operations including:
receiving fan duty information associated with a fan of a computing device having a plurality of fan positions and a chassis indicator light, the fan being installed at one of the plurality of fan positions;
determining a safe fan speed associated with the fan using the received fan duty information;
receiving a current fan speed associated with the fan;
generating a fan safety inference using the current fan speed and the safe fan speed, wherein generating the fan safety inference comprises comparing the current fan speed with the safe fan speed;
generating a maintenance warning when the fan safety inference is indicative of an unsafe condition; and
transmitting the maintenance warning to the computing device, wherein the maintenance warning, when received by the computing device, causes the computing device to output a visual indication of the fan position of the computing device in which the fan is installed, and wherein outputting the visual indication includes driving the chassis indicator light using one of a plurality of lighting patterns, wherein the plurality of lighting patterns includes a unique lighting pattern for each of the plurality of fan positions, and wherein the one of the plurality of lighting patterns is associated with the fan position in which the fan is installed.

14. The computer-program product of claim 13, wherein the fan safety inference is indicative of the unsafe condition when the current fan speed is lower than the safe fan speed.

15. The computer-program product of claim 13, wherein determining the safe fan speed comprises applying the received fan duty information to a lookup table to identify a safe fan speed.

16. The computer-program product of claim 13, wherein receiving the fan duty information associated with the fan of the computing device comprises receiving the fan duty information through a network interface.

17. The computer-program product of claim 13, wherein the operations further comprise taking a mitigation action when the fan safety inference is indicative of an unsafe condition, wherein taking the mitigation action includes adjusting a fan duty used to drive the fan or an alternate fan of the computing device.

18. The computer-program product of claim 17, wherein the operations further comprise:
- taking one or more additional mitigation actions associated with the fan or another fan of the computing device;
- calculating a total number of mitigation actions taken in association with the computing device, wherein the total number of mitigation actions taken includes the mitigation action and the one or more additional mitigation actions;
- determining that the total number of mitigation actions exceeds a threshold; and
- restricting further mitigation action and issuing a critical warning in response to determining that total number of mitigation actions exceeds a threshold.

* * * * *